US009696354B2

(12) United States Patent
Coutelou et al.

(10) Patent No.: US 9,696,354 B2
(45) Date of Patent: Jul. 4, 2017

(54) SYSTEM FOR MEASURING ELECTRIC POWER, TRANSFORMER SUBSTATION COMPRISING ONE SUCH SYSTEM AND METHOD FOR MEASURING ELECTRIC POWER WITH SUCH A SYSTEM (75) Inventors: Olivier Coutelou, Grenoble (FR); Pascal Houbre, Jarrie (FR); Francois Vincent, Le Cheylas (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 444 days.

(21) Appl. No.: 14/236,788

(22) PCT Filed: Aug. 2, 2012

(86) PCT No.: PCT/EP2012/065160
§ 371 (c)(1),
(2), (4) Date: Apr. 11, 2014

(87) PCT Pub. No.: WO2013/017663
PCT Pub. Date: Feb. 7, 2013

(65) Prior Publication Data
US 2014/0239941 A1  Aug. 28, 2014

(30) Foreign Application Priority Data

Aug. 4, 2011 (FR) ...................... 11 57170

(51) Int. Cl.
*G01R 11/00* (2006.01)
*G01R 21/06* (2006.01)
(Continued)

(52) U.S. Cl.
CPC ........... *G01R 21/06* (2013.01); *G01R 21/133* (2013.01); *G01R 22/063* (2013.01)

(58) Field of Classification Search
CPC ......... G01R 11/00; G01R 11/32; G01R 11/33; G01R 11/34; G01R 21/06; G01R 21/00;
(Continued)

(56) References Cited

U.S. PATENT DOCUMENTS

2005/0083206 A1* 4/2005 Couch .................... G01D 21/00
340/657
2005/0222784 A1* 10/2005 Tuff ........................ G06Q 50/06
702/61
(Continued)

FOREIGN PATENT DOCUMENTS

GB  2 452 989  3/2009
WO  2009 140777  11/2009

OTHER PUBLICATIONS

U.S. Appl. No. 14/301,517, filed Jun. 11, 2014, Coutelou, et al.
(Continued)

*Primary Examiner* — Son Le
(74) *Attorney, Agent, or Firm* — Oblon, McClelland, Maier & Neustadt, L.L.P.

(57) ABSTRACT

A system to measure electrical energy of current in a secondary electrical conductor connected to a primary electrical conductor, the primary and secondary conductors having substantially same voltage. The system includes a primary module including an emitter and a unit for measuring voltage of the primary conductor, at least one secondary module including a receiver, an intensity sensor of current in the secondary conductor, and a unit for calculating energy of the current. The primary module compresses the measured voltage value and emits, to each secondary module, a first message containing the compressed measured voltage value. A time synchronization mechanism performs time synchronization of each intensity sensor with the voltage measuring unit. The calculating unit is connected to the receiver and
(Continued)

can calculate energy from the measured voltage and intensity values.

14 Claims, 6 Drawing Sheets

(51) Int. Cl.
*G01R 21/133* (2006.01)
*G01R 22/06* (2006.01)

(58) Field of Classification Search
CPC .. G01R 15/18; G01R 15/186; G01R 19/0084; G01R 19/0092; G01R 19/2513; G01R 22/00
See application file for complete search history.

(56) References Cited

U.S. PATENT DOCUMENTS

| | | |
|---|---|---|
| 2007/0038394 A1 | 2/2007 | Gagnon et al. |
| 2011/0010118 A1 | 1/2011 | Gaarder |
| 2011/0131793 A1* | 6/2011 | Woodbury ............. G01R 15/18 29/592.1 |

OTHER PUBLICATIONS

U.S. Appl. No. 14/541,347, filed Nov. 14, 2014, Coutelou, et al.
International Search Report Issued Sep. 25, 2012 in PCT/EP12/065160 Filed Aug. 2, 2012.

\* cited by examiner

SYSTEM FOR MEASURING ELECTRIC POWER, TRANSFORMER SUBSTATION COMPRISING ONE SUCH SYSTEM AND METHOD FOR MEASURING ELECTRIC POWER WITH SUCH A SYSTEM

BACKGROUND OF THE INVENTION

This invention relates to a system for measuring the electrical energy of the current flowing in at least one secondary electrical conductor, the secondary conductor being electrically connected to a primary electrical conductor, the primary conductor and the or each secondary conductor having substantially the same voltage, with this measurement system comprising:
- a primary module comprising a radioelectric emitter and a measuring unit for measuring the voltage of the primary conductor,
- at least one secondary module comprising a radioelectric receiver, an intensity sensor for measuring the intensity of the current flowing in the corresponding secondary conductor and a unit for calculating the electrical energy of said current flowing in the corresponding secondary conductor.

This invention further relates to a unit for transforming an electrical current having a first alternating voltage into an electrical current having a second alternating voltage, this transformation unit comprising such a measurement system.

This invention further relates to a method for measuring electrical energy with such a measurement system.

It is known from document WO 2010/119332 A1 a measurement system of the aforementioned type. The measurement system comprises modules for measuring electrical energy, a database for storing measured values of the energy and a management module able to supply, to remote clients, information corresponding to the measured and collected values. The measurement modules are connected via radioelectric links to a communication gateway which is itself connected to a network. The database, the management module and the remote clients are also connected to the network. Each measurement module is able to measure the electrical energy of the current flowing in an electrical conductor. It comprises an intensity sensor, a processing unit able to calculate the electrical energy and a radioelectric emitter-receiver. Each measurement module is synchronised with the communication gateway via a clock.

However, such a measurement system is not very precise, with the calculation of the energy factor carried out through the detection of the maximums for the current and for the voltage and the calculation of the time that separate them. This system is also not very precise as it does not take into account in the calculation the energy produced by any harmonics present in the voltage and current signals. In addition, such a measurement system is relatively complex and expensive.

SUMMARY OF THE INVENTION

The purpose of the invention is therefore to propose a measurement system that is more precise, less complex and less expensive.

To this end, the subject-matter the invention is a measurement system of the aforementioned type, characterised in that:
- the primary module comprises first compression means for compressing the measured value of the voltage and emission means for emitting, from the radioelectric emitter to the radioelectric receiver of the or each secondary module, a first message containing the compressed value of the voltage measured by the measuring unit,
- the measurement system comprises synchronisation means for time synchronising the or each intensity sensor with the voltage measuring unit, and
- the calculating unit is connected to the radioelectric receiver and able to calculate the electrical energy from the measured voltage value voltage received from the primary module and from the intensity value measured by the intensity sensor.

According to other advantageous aspects of the invention, the measurement system comprises one or several of the following features, taken separately or according to all technically possible combinations:
- the or each secondary module is adapted to measure only the intensity of the current flowing in the corresponding secondary conductor, without measuring the voltage of said current flowing in the corresponding secondary conductor;
- the first message comprises synchronisation data for the time synchronisation of the or each intensity sensor with the voltage measuring unit;
- the first compression means comprise first calculation means for calculating coefficients of the decomposition into Fourier series of said voltage value measured by the measuring unit of the primary module;
- the or each secondary module comprises second compression means for compressing the measured value of the intensity;
- the second compression means comprise second calculation means for calculating coefficients of the decomposition into Fourier series of said intensity value measured by the sensor of the secondary module;
- the calculating unit is able to calculate the electrical energy from the compressed values of the measured intensity and of the measured voltage;
- the system comprises a plurality of secondary modules and a centralisation module for centralising the calculated values of electrical energy, the centralisation module comprising a radioelectric receiver, and each secondary module comprises emission means for emitting, from the radioelectric emitter to the radioelectric receiver of the centralisation module, a second message containing the value of the energy calculated by the calculating unit;
- the primary module comprises means for successively distributing a unique token to the secondary modules and the emission means of the secondary module are adapted to emit the second message only when the corresponding secondary module has received beforehand the unique token from the primary module; and
- the first message contains the value of a sampling period at which are calculated coefficients for the decomposition into Fourier series of said measured voltage value of the and/or of said measured intensity value.

The subject-matter of the invention is also a unit for transforming an electrical current having a first alternating voltage into an electrical current having a second alternating voltage, comprising:
- a first panel comprising at least one inlet electrical conductor able to be connected to an electrical network, with the current flowing in the inlet conductor having the first alternating voltage,
- a second panel comprising at least one primary outlet electrical conductor and at least one secondary outlet electrical conductor, the or each secondary outlet conductor being connected electrically to a corresponding primary outlet conductor, with the current flowing in the corresponding outlet conductors having the second alternating voltage, an electric transformer connected between the first panel and the second panel and able to transform the current having the first alternating voltage into the current having the second alternating voltage, and a measurement system for measuring the electrical energy of the current flowing in the or each secondary outlet conductor, wherein the measurement system is such as defined hereinabove.

The subject-matter of the invention is also a method for measuring the electrical energy of the current flowing in at least one secondary electrical conductor, the secondary conductor being electrically connected to a primary electrical conductor, the primary conductor and the or each secondary conductor having substantially the same voltage, with the method comprising the following steps:

(a) the measurement, by a primary module, of the voltage of the current flowing in the primary conductor, (b) the measurement, by a secondary module, of the intensity of the current flowing in the corresponding secondary conductor, and (c) the calculation, by the secondary module, of the electrical energy of said current flowing in the corresponding secondary conductor, wherein the method further comprises the following steps:

(i) the compression of the measured voltage value and the emission, by the primary module, of a first message containing the compressed value of the measured voltage, via a radioelectric link between the primary module and the secondary module, and (ii) the time synchronisation of the measurement of the intensity with the measurement of the voltage, and during the step (c), the calculation of the electrical energy is carried out from the measured voltage value received from the primary module and from the intensity value measured by the intensity sensor.

According to another advantageous aspect of the invention, the measurement method comprises the following feature:

the period of the voltage is measured regularly by the primary module, the period of measurement being preferably equal to 10 seconds.

BRIEF DESCRIPTION OF THE DRAWINGS

These features and advantages of the invention shall appear when reading the following description, given solely by way of example, and made in reference to the annexed drawings, wherein.

DETAILED DESCRIPTION OF PREFERRED EMBODIMENTS

Figure 1:
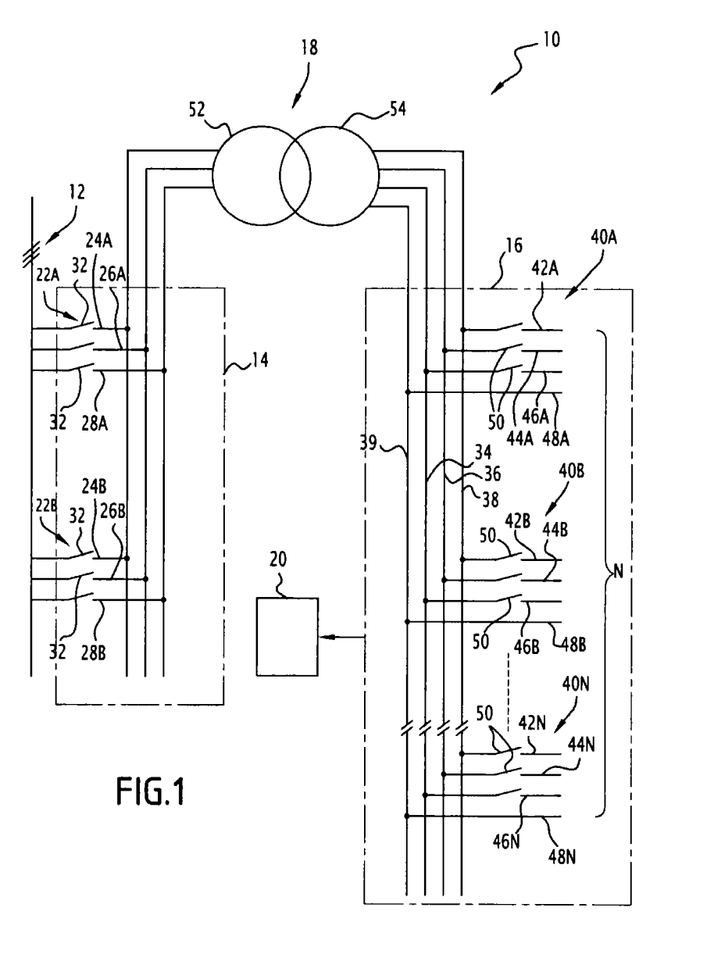
FIG. 1 is a block diagram of a transformation unit comprising a first panel, a second panel connected to the first panel via a transform and a system for measuring the electrical energy of the current flowing in outlet conductors of the second panel.

In FIG. 1, a transformation unit 10 connected to an electrical network 12 comprises a first panel 14, a second panel 16, an electric transformer 18 connected between the first panel and the second panel and a system 20 for measuring the electrical energy of a current.

The transformation unit 10 is able to transform the electrical current delivered by the network 12 and having a first alternating voltage, into an electrical current having a second alternating voltage.

The electrical network 12 is an alternating network, such as a three-phase network. The electrical network 12 is a medium-voltage network, i.e. a network of which the voltage is greater than 1,000 Volts and less than 50,000 Volts. The first three-phase voltage is then a medium voltage.

Alternatively, the electrical network 12 is a high-voltage network, i.e. a network of which the voltage is greater than 50,000 Volts. In other words, the first three-phase voltage is a high voltage.

The first panel 14 comprises several inlets 22, each inlet 22 comprising a first 24A, 24B, a second 26A, 26B, and a third 28A, 28B inlet conductors. Each first, second, third inlet conductor 24A, 24B, 26A, 26B, 28A, 28B is connected to the electrical network via a respective inlet circuit breaker 32. The three-phase current flowing in the corresponding inlet conductors 24A, 24B, 26A, 26B, 28A, 28B has the first three-phase voltage.

The second panel 16 comprises a first 34, a second 36, a third 38 and a fourth 39 primary conductors and a plurality N of outlets 40A, 40B, ... 40N, i.e. a first outlet 40A, a second outlet 40B, ..., an Nth outlet 40N, each outlet 40A, 40B, ..., 40N being able to deliver a three-phase voltage.

Each outlet 40A, 40B, 40N is a low-voltage outlet, i.e. an outlet of which the voltage is less than 1,000 Volts. The second three-phase voltage is then a low voltage.

Alternatively, each outlet 40A, 40B, ..., 40N is a medium-voltage outlet, i.e. an outlet of which the voltage is greater than 1,000 Volts and less than 50 000 Volts. In other words, the second three-phase voltage is a medium voltage.

The first outlet 40A comprises a first 42A, a second 44A, a third 46A and a fourth 48A secondary conductors and three outlet circuit breakers 50. The first, second and third secondary conductors 42A, 42B, 42C are respectively connected to the first, second and third primary conductors 34, 36, 38 via a corresponding outlet circuit breaker 50. The fourth secondary conductor 48A is directly connected to the fourth primary conductor 39.

The primary outlet conductors 34, 36, 38 and the corresponding secondary outlet conductors 42A, 44A, 46A have substantially the same voltage, i.e. respectively a first voltage V1, a second voltage V2 and a third voltage V3 corresponding to the three phases of the second three-phase voltage.

The other outlets 40B, . . . 40N are identical to the first outlet 40A described hereinabove, and comprise the same elements by replacing each time the letter A with the corresponding letter B, . . . , N concerning the references of the elements.

The electric transformer 18 is able to transform the current coming from the electrical network having the first alternating voltage into the current delivered to the second panel 16 and having the second alternating voltage. The electric transformer 18 comprises a primary winding 52 connected to the first panel 14 and a secondary winding 54 connected to the second panel 16.

The measurement system 20 is able to measure the electrical energy of the current flowing in the or each secondary outlet conductor 42A, 44A, 46A, 42B, 44B, 46B, . . . , 42N, 44N, 46N.

Figure 2:
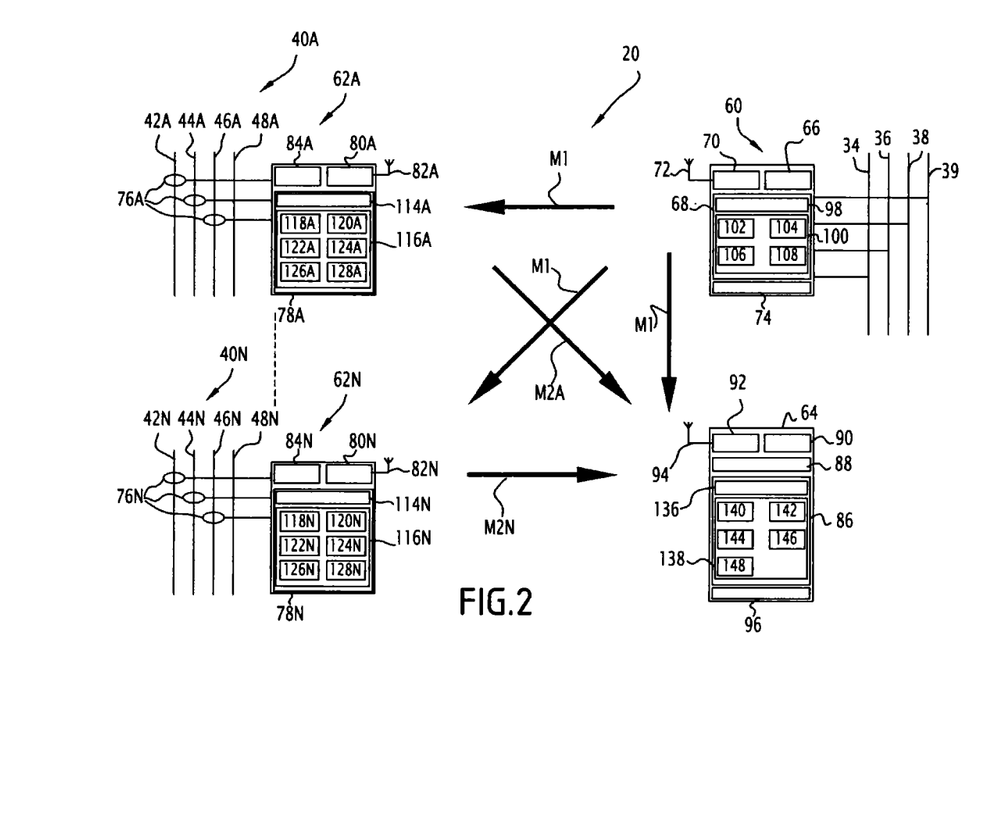
FIG. 2 is a block diagram of the measurement system of FIG. 1, with the measurement system comprising a primary module for measuring the voltage, a plurality of secondary modules for measuring the intensity and a centralisation module.

The measurement system 20, which can be seen in FIG. 2, comprises a primary module 60, a plurality N of secondary modules 62A, 62B, . . . , 62N, i.e. a first secondary module 62A, a second secondary module 62B, not shown, . . . and an Nth secondary module 62N, and a centralisation module 64.

The primary module 60 comprises a voltage measuring unit 66 for measuring the voltage of the current flowing in the corresponding primary conductor 34, 36, 38, and an information processing unit 68. The primary module 60 further comprises a radioelectric emitter-receiver 70, a radioelectric antenna 72, and an electrical supply unit 74 for the unit for measuring, the information processing unit and the radioelectric emitter-receiver.

The first secondary module 62A comprises, for each of the first 42A, second 44A and third 46A secondary conductors, an intensity sensor 76A for measuring the intensity of the current flowing in the corresponding secondary conductor 42A, 44A, 46A. The first secondary module 62A comprises an information processing unit 78A, a radioelectric emitter-receiver 80A, and a radioelectric antenna 82A. The first secondary module 62A further comprises an electrical supply unit 84A for the information processing unit and the radioelectric emitter-receiver. The first secondary module 62A is identified by a unique number, also referred to as identifier.

The other secondary modules 62B, . . . , 62N are identical to the first secondary module 62A described hereinabove, and comprise the same elements by replacing each time the letter A with the corresponding letter B, N concerning the references of the elements. Each of the other secondary modules 62B, . . . , 62N also has a unique identifier.

The centralisation module 64 comprises an information processing unit 86, a database 88 and a man-machine interface 90. The centralisation module 64 comprises a radioelectric emitter-receiver 92, a radioelectric antenna 94 and an electrical supply unit 96 for the information processing unit, the database, the man-machine interface and the radioelectric emitter-receiver.

The voltage measuring unit 66 is able to measure the first voltage V1 of the phase flowing through the first primary conductor 34, also referred to as phase number 1 and noted as Phase_1, the second voltage V2 of the phase flowing through the second primary conductor 36, also referred to as phase number 2 and noted as Phase_2, and the third voltage V3 of the phase flowing through the third primary conductor 38, also referred to as phase number 3 and noted as Phase_3.

The measuring unit 66 is also able to measure the frequency F of the three-phase voltage flowing through the primary conductors 34, 36, 38.

The information processing unit 68 comprises a processor 98 and a memory 100 able to store a software 102 for measuring the measured voltages V1, V2, V3, a compression software 104 for compressing the samples of the measured voltages. The memory 100 is able to store an emission software 106 for emitting a first message M1 to each secondary module 62A, . . . , 62N and to the centralisation module 64, and a distribution software 108 for successively distributing a unique token to the secondary modules 62A, . . . , 62N.

The radioelectric emitter-receiver 70 is compliant with the communication protocol ZigBee based on the standard IEEE-802.15.4. Alternatively, the radioelectric emitter-receiver 70 is compliant with the standard IEEE-802.15.1 or with the standard IEEE-802. 15.2. As a further alternative, the radioelectric emitter-receiver 70 is compliant with the standard IEEE-802-11.

The radioelectric antenna 72 is adapted to emit radioelectric signals to antennas 82A, . . . , 82N of the secondary modules and to the antenna 94 of the centralisation module, and also to receive radioelectric signals from said antennas 82A, . . . , 82N, 94. In other words, the primary module 60 is connected to each of the secondary modules 62A, . . . , 62N and to the centralisation module 64 by a corresponding radioelectric link.

The supply unit 74 is able to electrically supply the measuring unit 66, the information processing unit 68 and the radioelectric emitter-receiver 70 from the three-phase voltage flowing through the primary conductors 34, 36, 38.

Each intensity sensor 76A of the first secondary module 62A is able to measure a respective intensity from among a first intensity I1A flowing in the first outlet secondary conductor 42A, a second intensity I2A flowing in the second outlet secondary conductor 44A and a third intensity I3A flowing in the third outlet secondary conductor 46A.

Figure 3:
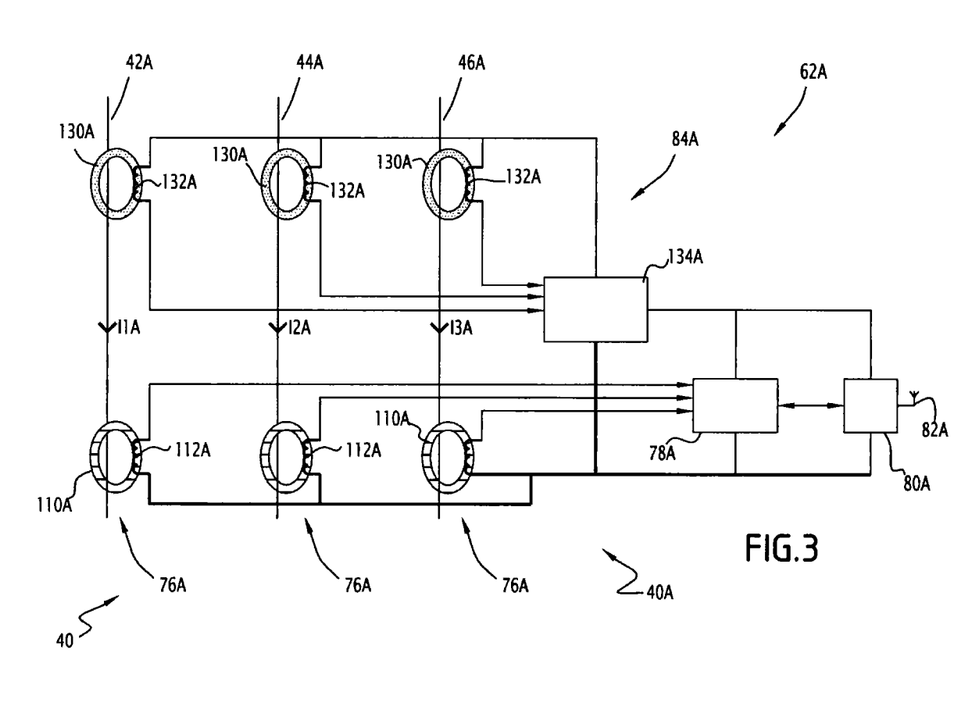
FIG. 3 is a block diagram of the secondary module of FIG. 2.

Each intensity sensor 76A, also referred to as current sensor, comprises a first coil 110A arranged around the corresponding secondary outlet conductor 42A, 44A, 46A and a first winding 112A arranged around the first coil, as shown in FIG. 3. The flow of the current through the corresponding secondary outlet conductor is able to generate an induced current proportional to the intensity of the current in the first winding 112A. The first coil 110A is a Rogowski coil. The first coil 110A is preferably an open-type coil in order to facilitate its arranging around the corresponding conductors.

The information processing unit 78A, which can be seen in FIG. 2, comprises a data processor 114A, and a memory 116A associated with the data processor and able to store a measurement software 118A for measuring measured values of respective intensities, a reception software 120A for receiving the first message M1, a synchronisation software 122A for time synchronisation of each current sensor 76A in relation to the unit 66 for measuring the voltage. The memory 116A is able to store a compression software 124A for compressing the sampled values of the first, second and third intensities I1A, I2A, I3A, a calculation software 126A for calculating the electrical energy of the current flowing in the corresponding secondary conductor 42A, 44A, 46A, and an emission software 128A for emitting a second message M2A to the centralisation module 64.

The radioelectric emitter-receiver 80A is of the same type as the radioelectric emitter-receiver 70.

The radioelectric antenna 82A, of the same type as the radioelectric antenna 72, is adapted to receive radioelectric signals from the antenna 72 of the primary module and from the antenna 94 of the centralisation module and also to emit radioelectric signals to the antennas 72, 94.

The supply unit 84A, which can be seen in FIG. 3, is able to supply the information processing unit 78A and the radioelectric emitter-receiver 80A. The supply unit 84A comprises, for each of the first 42A, second 44A and third 46A secondary conductors, a second coil 130A arranged around the corresponding secondary conductor 42A, 44A, 46A and a second winding 132A arranged around the second coil. The flow of the current in the corresponding secondary conductor 42A, 44A, 46A is able to generate an induced current in the second winding 132A.

The supply unit 84A comprises a converter 134A connected to each of the second windings 132A and able to deliver a predetermined voltage to the information processing unit 78A and to the radioelectric emitter-receiver 80A. Each second coil 130A is an iron core. Each second coil 130A is preferably an open-type coil in order to facilitate its arranging around the corresponding conductors.

In other words, the secondary module 62A is self-powered via the supply unit 84A comprising the second coils 130A adapted to recover the magnetic energy coming from the flow of the current in the corresponding secondary conductors 42A, 44A, 46A.

The elements of the other secondary modules 62B, . . . , 62N are identical to the elements of the first secondary module 62A described hereinabove, and comprise the same sub-elements by replacing each time the letter A with the corresponding letter B, . . . , N concerning the references of the sub-elements.

The information processing unit 86 of the centralisation module, which can be seen in FIG. 2, comprises a data processor 136, and a memory 138 associated with the processor and able to store a reception software 140 for receiving first and second messages M1, M2A, . . . , M2N, a recording software 142 for recording in the database 88 information contained in the received messages M1, M2A, . . . , M2N. The memory 138 is able to store a display software 144 for processing said information received, a software 146 for displaying data and a transmission software 148 for transmitting data to a remote server, not shown.

The man-machine interface 90 comprises a display screen and a keyboard, not shown. Alternatively, the man-machine interface 90 comprises a touch-sensitive screen and the key-entry of the data is carried out via tactile buttons displayed on the screen.

The radioelectric emitter-receiver 92 is of the same type as the radioelectric emitter-receivers 70, 80A, . . . , 80N.

The radioelectric antenna 94, of the same type as the radioelectric antennas 72, 82A, . . . , 82N, is able to receive radioelectric signals coming from the antenna 72 of the primary module and from the antennas 82A, . . . , 82N of the secondary modules and also to emit radioelectric signals to said antennas 72, 82A, . . . , 82N.

Figure 4:
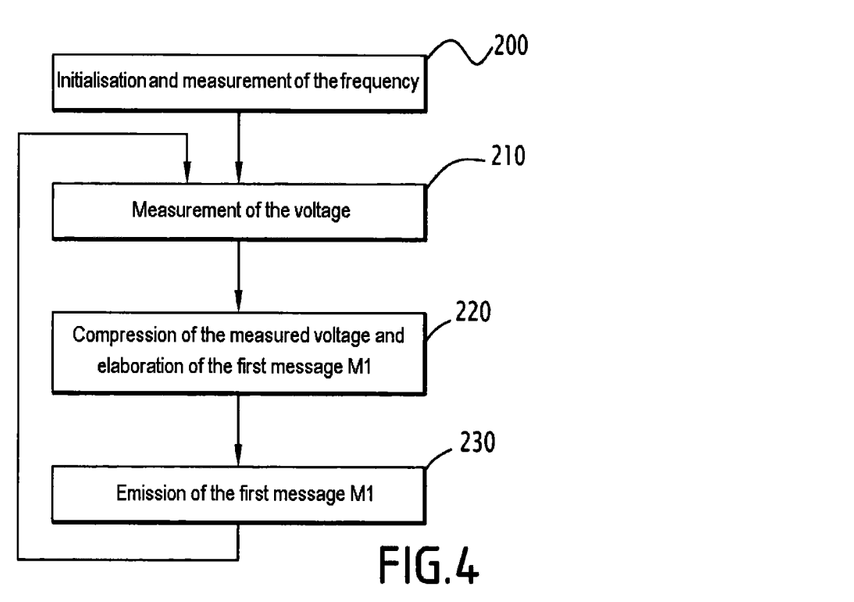
FIG. 4 is a flowchart of the steps of a measuring method according to the invention, implemented by the primary module of FIG. 2.
Figure 5:
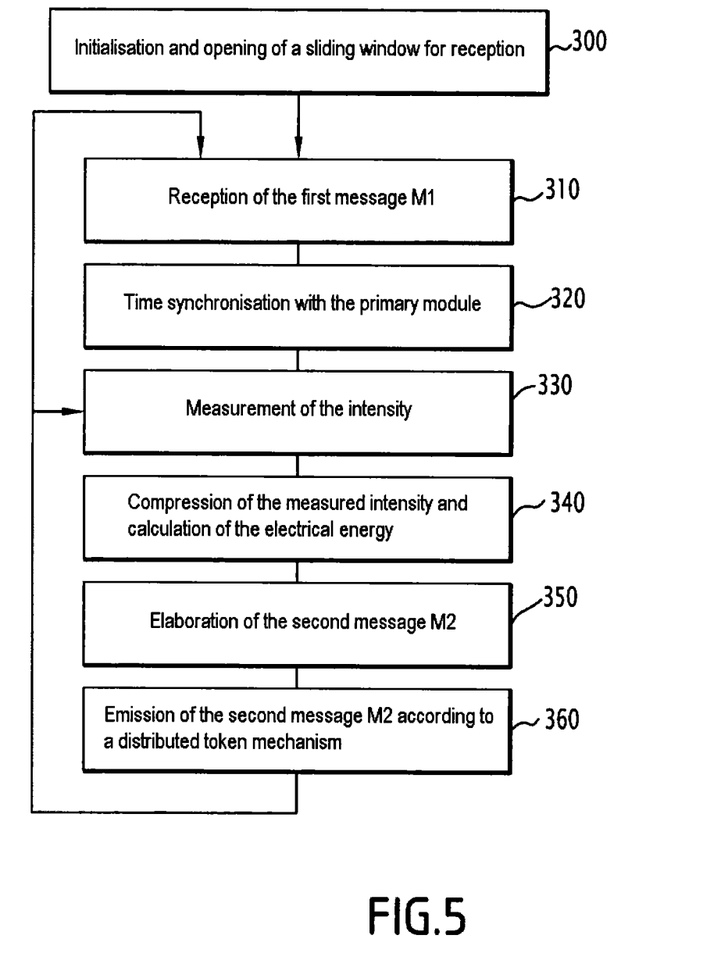
FIG. 5 is a flow chart of the steps of the same measuring method, implemented by the secondary modules of FIGS. 2 and 3.
Figure 6:
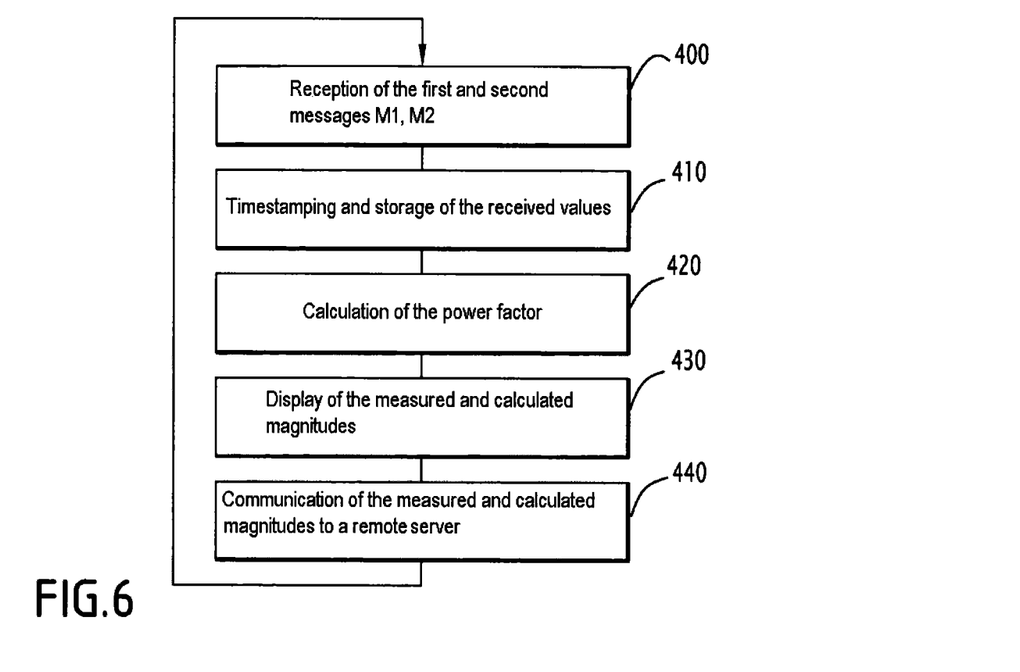
FIG. 6 is a flow chart of the steps of the same measuring method, implemented by the centralisation module of FIG. 2.

The operation of the measurement system 20 shall now be explained using FIGS. 4, 5 and 6 showing flowcharts of the steps of a method for measuring implemented respectively by the primary module 60, by the secondary modules 62A, . . . , 62N and by the centralisation module 64.

As shown in FIG. 4, during a first step 200, the primary module 60 is initialised and measures the frequency F of the three-phase voltage flowing through the primary conductors 34, 36, 38 via the measuring software 102. The frequency F of the three-phase voltage is equal to 50 Hz.

The primary module 60 then measures, during the step 210, the first, second and third voltages V1, V2, V3 using its unit for measuring 66 and its measuring software 102. The software 102 furthermore samples the measured values of the voltages V1, V2, V3. The sampling period $P_{samp}$ of the measured voltage is a multiple of the period $P_{voltage}$ of the three-phase voltage equal to the inverse of the frequency F of said three-phase measured hereinabove during the step 200. The period $P_{voltage}$ of the three-phase voltage is equal to 20 ms.

During the step 220, the primary module 60 compresses the measured values of the voltages V1, V2, V3 using its compression software 104, in order to limit the quantity of data transmitted via the radioelectric links between the primary module 60 and the secondary modules 62A, . . . , 62N. The compression software 104 is able to calculate a predetermined number K of the first coefficients Re_j(Vi), Im_j(Vi) of the decomposition into Fourier series of each of the voltages V1, V2, V3 of the three phases, where i is the number equal to 1, 2 or 3 of the phase, and j is between 1 and K. The predetermined number K is preferably equal to 5.

The coefficients of the decomposition into Fourier series are, for example, obtained by correlation operations on the samples of measured values. More precisely, the real coefficient of the fundamental, noted as Re_1(Vi), is a correlation, over a duration equal to the period $P_{voltage}$ of the three-phase voltage, between the samples of the voltage signal Vi and a cosine frequency equal to the frequency F of the three-phase voltage, where Vi shows the voltage of the phase, i being equal to 1, 2 or 3. The imaginary coefficient of the fundamental, noted as Im_1(Vi), is a correlation, over a duration equal to the period $P_{voltage}$, between the samples of the voltage signal Vi and a sine frequency equal to the frequency F.

The real coefficient of the harmonic number j, noted as Re_j(Vi), j being between 2 and K, is the correlation, over a duration equal to the period $P_{voltage}$, between the samples of the voltage signal Vi and a cosine frequency equal to j times the frequency F. The imaginary coefficient of the harmonic number j, noted as Im_j(Vi), is the correlation, over a duration equal to the period $P_{voltage}$, between the samples of the voltage signal Vi and a sine frequency equal to j times the frequency F.

The compression software 104 calculates therefore the complex coefficients Re_j (Vi), Im_j(Vi) of the compositions into Fourier series of the three voltages V1, V2, V3 for the fundamental and the harmonics 2 to K.

Finally, during the step 230, the primary module 60 emits the first message M1 to each of the secondary modules 62A, . . . , 62N and to the centralisation module 64. The first message M1 is preferably emitted periodically. The emission period $P_{emission}$ is predetermined, and preferably equal to one second. In other words, the first message M1 is emitted every second.

The first message M1 contains in particular synchronisation data, the sampling period $P_{samp}$, the coefficients Re_j (Vi), Im_j(Vi) of the decompositions into Fourier series of the three voltages V1, V2, V3 until the harmonic K, calculated hereinabove during the step 220, and the identifier of the secondary module which will be authorised to emit its second message to the centralisation module 64 after the reception of the first message M1. The identifier of the secondary module authorised to emit its measurement information is determined using the software for distributing a unique token 108, with the identifier of the module contained in the first message M1 making it possible to designate the secondary module to which the unique token has been assigned.

As a supplement, the first message M1 contains the values of the root mean squares, also noted as RMS, of each of the three voltages V1, V2, V3.

After the emission of the first message M1, the primary module 60 returns to the step 210 in order to again measure the voltage V1, V2, V3 of the phases of the three-phase voltage flowing in the primary conductors 34, 36, 38.

The steps, which can be seen in FIG. 5, of the measuring method implemented by the secondary modules 62A, . . . , 62N shall now be described for the first secondary module 62A.

During the step 300, the first secondary module 62A is initialised and opens a sliding window for receiving the first message M1 using its receiving software 120A. The receiving window is a window having a duration of a few tens of milliseconds that the first secondary module 62A slides over time.

During the reception of the first message M1 using the receiving software 120A, the first secondary module 62A checks that the first message M1 contains the synchronisation data and then passes to the step 320 of time synchronisation with the primary module 60.

During the step 320, the synchronisation software 122A initialises, at the date of reception of the first message M1, a meter intended to be incremented until a value corresponding to the emission period of the first message $P_{emission}$. The secondary module 62A then automatically returns to the reception step 310 about one millisecond before the expected reception of the next first message M1. The synchronisation software 122A also carries out the resynchronisation of the sampling using the value of the sampling period $P_{samp}$ contained in the first message M1 and the date of reception of the first message M1.

The reception date of the first message M1 if the reference date for the synchronisation of the first secondary module 62A with the primary module 60, and more precisely for the synchronisation of the measurement of the intensities I1A, I2A, I3A in relation to the measurement of voltages V1, V2, V3.

If the first message M1 is not detected by the first secondary module 62A, the receiving window is closed and no synchronisation is carried out.

The first secondary module 62A then measures, during the step 330 and via its current sensors 76A and via its measuring software 118A, each of the first, second and third intensities I1A, I2A, I3A. The measuring software 118A furthermore samples the measured values of the three intensities I1A, I2A, I3A, the beginning instant of the sampling having been reinitialised during the preceding step 320 in order to ensure the time synchronisation of the intensity sensor 76A with the voltage measuring unit 66.

The compression software 124A then compresses the measured values of the intensities I1A, I2A, I3A during the step 340. The compression software 124A calculates, for example, the predetermined number K of first complex coefficients Re_j(IiA), Im_j(IiA) of the decomposition into Fourier series of the three currents I1A, I2A, I3A of the three phases in a way similar to the calculation, described for the step 220, of the complex coefficients Re_j(Vi), Im_j(Vi) of the decomposition into Fourier series of the voltages.

The real coefficient of the fundamental, also noted as Re_1(IiA), is a correlation, over a duration equal to the period $P_{voltage}$ of the three-phase voltage, between the samples of the signal of the intensity IiA and a cosine frequency equal to the frequency F of the three-phase voltage, where IiA shows the intensity of the phase number i, i being equal to 1, 2 or 3. The imaginary coefficient of the fundamental, also noted as Im_1(IiA), is a correlation, over a duration equal to the period $P_{voltage}$, between the samples of the signal of the intensity IiA and a sine frequency equal to the frequency F.

The real coefficient of the harmonic number j, noted as Re_j(IiA), j being between 2 and K, is the correlation, over a duration equal to the period P voltage, between the samples of the signal of the intensity IiA and a cosine frequency equal to j times the frequency F. The imaginary coefficient of the harmonic number j, noted as Im_j(IiA), j being between 2 and K, is the correlation, over a duration equal to the period P voltage, between the samples of the signal of the intensity IiA and a sine frequency equal to j times the frequency F.

The compression software 124A calculates therefore the complex coefficients Re_j(IiA), Im_j(IiA) of the decompositions into Fourier series of the three intensities I1A, I2A, I3A for the fundamental and the harmonics 2 to K.

The calculation software 126A then periodically calculates the active energy $E_1$, $E_2$, $E_3$ for each of the three phases using the values of the measured voltages V1, V2, V3 received from the primary module 60 via the first message M1 and the values of the intensities I1A, I2A, I3A measured by the current sensors 76A. The period of calculation of the active energies $E_1$, $E_2$, $E_3$ is equal to the period $P_{voltage}$, which is for example 20 ms.

The variations of the voltages V1, V2, V3 are sufficiently limited between two emission instants of the first message M1, i.e. over a period of one second, to allow calculating the active energies $E_1$, $E_2$, $E_3$ every 20 ms, using the values of the intensities I1A, I2A, I3A measured every 20 ms and the values of the voltages V1, V2, V3 received every second.

For the calculation of the active energies $E_1$, $E_2$, $E_3$, the calculation software 126A calculates, at each period $P_{voltage}$, an active power $P_i$ of each phase number i, i being equal to 1, 2 or 3, using the following equations:

$$P_{i,j} = \frac{[\text{Re}\_j(Vi) \times \text{Re}\_j(IiA) + \text{Im}\_j(Vi) \times \text{Im}\_j(IiA)]}{2} \qquad (1)$$

where j is between 1 and K $$P_i = \sum_{j=1}^{K} P_{i,j} \qquad (2)$$

The calculation software 126A also determines, at each period $P_{voltage}$, the reactive power $Q_i$ of each phase number i, i being equal to 1, 2 or 3, using the following equations:

$$Q_{i,j} = \frac{[\text{Im}\_j(Vi) \times \text{Re}\_j(IiA) - \text{Re}\_j(Vi) \times \text{Im}\_j(IiA)]}{2} \qquad (3)$$

where j is between 1 and K $$Q_i = \sum_{j=1}^{K} Q_{i,j} \qquad (4)$$

The active energy $E_i$ of each phase number i is finally calculated by incrementing for each phase a positive energy meter $E_i+$ when the term $P_{i,1}$ calculated using the equation (1) is positive, and by incrementing for each phase a negative energy meter $E_i-$ when the term $P_{i,1}$ is negative. The term $P_{i,1}$ shows the power corresponding to the product of the current fundamental and the voltage fundamental. The power meters $E_1+$, $E_1-$, $E_2+$, $E_2-$, $E_3+$, $E_3-$ are incremented for the three phases of the three-phase voltage, in order to calculate the active energies $E_1$, $E_2$, $E_3$ for the three phases of the three-phase voltage.

The first secondary module 62A then elaborates, during the step 350, its second message M2A. The second message M2A contains the identifier of the first secondary module 62A, the values of the six energy meters $E_1-$, $E_2+$, $E_2-$, $E_3+$, $E_3-$ for all of the three phases of the three-phase voltage and the complex coefficients Re_j(IiA), Im_j(IiA) of the decomposition into Fourier series of the three currents I1A, I2A, I3A until the harmonic K.

As a supplement, the second message M2A contains the values of the root mean squares, also noted as RMS, of the currents I1A, I2A, I3A of the three phases, as well as the terms $P_{i,1}$ and $Q_{i,1}$ for each of the three phases, and the values $P_i$ and $Q_i$ for each of the three phases.

In the hypothesis where the identifier of the first secondary module 62A was contained in the first message M1 received previously, the first secondary module 62A then emits during the step 360 its second message M2A using its emission software 128A. Otherwise, the first secondary module 62A directly returns to the step 310 of receiving the first message M1, and will emit its second message M2A when the first message M1 contains its identifier then indicating that the unique token has been assigned to it in order to authorise it to emit its second message M2A.

After the step of emission 360 in the case where the token had been assigned to the first secondary module 62A, or well after the step 350 otherwise, the first secondary module 62A returns to the step of receiving 310 of the meter has reached the value corresponding to the emission period of the first message $P_{emission}$, or to the measuring step 330 otherwise.

The steps of the measuring method implemented by the other secondary modules 62B, . . . , 62N are identical to the steps 300 to 360 described hereinabove for the first secondary module 62A, and are furthermore carried out simultaneously between all of the secondary modules 62A, . . . , 62N through the time synchronisation carried out using the first message M1.

During the emission step 360, the only secondary module among all of the secondary measurements 62A, . . . , 62N authorised to emit its second message is the secondary module of which the identified is contained in the first message M1 received during the preceding step of reception 310. The distribution software 108 determines according to an increasing order the identifiers contained in the first message M1 in order to successively assign the unique token to the secondary modules 62A, . . . , 62N. In other words, each secondary module 62A, . . . , 62N emits every N seconds its respective second message M2A, . . . , M2N.

As shown in FIG. 6, during the step 400, the centralisation module 64 receives, using its receiving software 140, the first message M1 from the primary module 60 and the second message from the secondary module authorised to emit according to the distributed token mechanism, for example the message M2A.

During the step 410, the centralisation module 64 then records in its database 88 the values received and contained in the first message M1 and in the second message M2A, via its recording software 142. As a supplement, the processing software 144 carries out a timestamping of the data recorded.

The processing software 144 calculates during the following step 420 the power factor $\cos(\phi_i)$ for each of the three phases numbered i of the three-phase voltage using the following equation:

$$\cos(\varphi_i) = \cos\left[\arctan\left(\frac{Q_{i,1}}{P_{i,1}}\right)\right] \quad (5)$$

The magnitudes measured and calculated by the measurement system are then displayed on the screen of the man-machine interface 90 of the centralisation module via the display software 146 during the step 430. These magnitudes are displayed in the form of numerical values and/or in the form of curves.

The centralisation module 64 finally transmits, during the step 440 and using its transmission software 148, these measured and calculated magnitudes to the remote server, not shown. The remote server is able to carry out a centralised management of the measured and calculated magnitudes for each measurement system 20.

At the end of the step 440, the centralisation module 64 returns to the step 400, in order to receive the next first message M1 from the primary module and the second message from the secondary module authorised to emit the next time according to the distributed token mechanism, for example the message M2A.

The measurement system 20 according to the invention is therefore less complex and less expensive than the measurement system of prior art since the secondary modules 62A, . . . , 62N are provided to measure only the intensity of each phase of the three-phase current flowing in the corresponding secondary conductors without measuring the voltage of each of the phases. The voltage of each phase is measured by the primary module 60, then transmitted to each of the secondary modules 62A, . . . , 62N. Each secondary module 62A, . . . , 62N then uses the voltage values received from the primary module 60 in combination with the intensity value of each phase measured by its current sensor 76A, . . . , 76N in order to calculate the electrical energy $E_1$, $E_2$, $E_3$ of each phase of the corresponding outlet 40A, . . . , 40N.

The measurement system 20 according to the invention furthermore makes it possible to obtain a very precise measurement of the active energies $E_1$, $E_2$, $E_3$ for the three phases of the three-phase current, through the time synchronisation of each current sensor 76A with the voltage measuring unit 66.

The time synchronisation is very precise, with the synchronisation offset measured being of a magnitude of more or less 400 nanoseconds with the current technology of radioelectric emitter-receivers 70, 80A, . . . , 80N, 92 and the information processing units 68, 78A, . . . , 78N, 86.

All of the modules 60, 62A, . . . , 62N, 64 are connected together by radioelectric links via their respective radioelectric emitter-receiver 70, 82A, . . . , 82N, 92, which makes it possible to facilitate the installation of the measurement system 20 in the transformation unit 10.

The compression of the data concerning the measured voltages and intensities using compression software 104, 124A, . . . , 124N allows to limit the quantity of data transmitted via the radioelectric links, and to therefore limit the power consumption of the measurement system 20. Furthermore, the compression of the data allows to reduce the sensitivity of the measurement system 20 to radioelectric disturbances of the scrambling type or electromagnetic compatibility disturbance, also referred to as CEM disturbance.

The emission of the second message M2A, . . . , M2N according to a distributed token mechanism makes it possible to reduce the radioelectric interferences between the secondary modules 62A, . . . , 62N.

According to another embodiment, not shown, the primary module 60 and the centralisation module 64 are grouped together into a same common module, which allows to have a unique radioelectric emitter-receiver for the common module instead of the two radioelectric emitter-receivers 70, 92 of the primary module and the centralisation module.

The other advantages of this second embodiment are identical to those of the first embodiment described hereinabove.

The operation of this second embodiment is moreover identical to that of the first embodiment described hereinabove.

The operation of the measurement system 20 according to another embodiment shall now be explained.

For each current sensor 76A, the flow of the current through the corresponding secondary outlet conductor is able to generate a signal proportional to the intensity of the current in the first winding 112A.

In FIG. 4, during the first step 200, the primary module 60 is initialised and measures the frequency F of the three-phase voltage of the primary conductors 34, 36, 38 via the measuring software 102. The frequency F of the three-phase voltage is equal to the frequency of the network, such as 50 Hz for example in Europe and 60 Hz for example in the United States.

The primary module 60 then measures, during the step 210, the first, second and third voltages V1, V2, V3 using its measuring unit 66 and its measuring software 102. The software 102 furthermore samples the measured values of the voltages V1, V2, V3. The sampling frequency $F_{samp}$ of the measured voltage is a multiple of the frequency F of the three-phase voltage equal to the inverse of the period $P_{voltage}$ of said three-phase voltage measured hereinabove during the step 200. The period $P_{voltage}$ of the three-phase voltage is equal to the period of the network, which is about 20 ms in Europe and about 16.66 ms in the United States.

During the step 210, in order to optimise the precision of the measurement of the energy, the period $P_{voltage}$ of the voltage is measured regularly in order to take into account the variations over time of the latter, for example every 10 seconds.

During the step 220, the coefficients of the decomposition into Fourier series of each of the voltages V1, V2, V3 of the three phases are calculated in a manner identical to what was described for the first embodiment.

Finally, during the step 230, the primary module 60 emits the first message M1 to each of the secondary modules 62A, . . . , 62N and to the centralisation module 64. The first message M1 is preferably emitted periodically. The emission period P emission is predetermined, and preferably equal to one second.

The first message M1 comprises a header field, also called a preamble, an SFD (Start of Frame Delimiter) field, a PHR (Physical Header) field, a data field and a CRC (Cyclic Redundancy Check) field. The preamble has a size of 4 bytes, the SFD and PHR fields each have a size of one byte, the data field is of variable size, noted as n bytes, and the CRC field has a size of 2 bytes. In the example embodiment of FIG. 7, the first message M1 is comprised of the header field, the SFD field, the PHR field, the data field and the CRC field.

Figure 7:
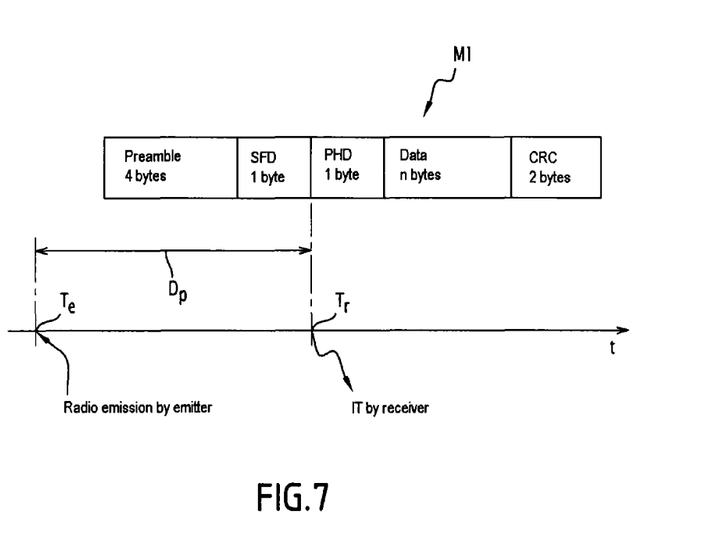
FIG. 7 is a time chart showing the emission and reception instants of a first message, the latter being emitted by the primary module to the secondary modules.

The data field of the first message M1 in particular contains the sampling period $P_{samp}$, the coefficients Re_j (Vi), Im_j(Vi) of the decompositions into Fourier series of the three voltages V1, V2, V3 until the harmonic K, calculated hereinabove during the step 220, and the identifier of the secondary module which will be authorised to emit its second message to the centralisation module 64 after the reception of the first message M1. The identifier of the secondary module authorised to emit its measurement information is determined using the software for the distribution of a unique token 108, the identifier of the module contained in the first message M1 makes it possible to designate the secondary module to which the unique token has been assigned.

As a supplement, the data field of the first message M1 contains the values of the root mean squares, also noted as RMS, of each of the three voltages V1, V2, V3.

During the step 300, the first secondary module 62A is initialised and opens the sliding window for receiving the first message M1 using its receiving software 120A.

During the reception of the first message M1, the first secondary module 62A detects the instant Tr of reception of the SFD field, with the reception of the SFD field resulting in the triggering of an interruption by the radioelectric receiver of the first secondary module 62A. The detection of the reception instant Tr then allows to calculate the instant Te at which the first message M1 was emitted by the radioelectric emitter of the primary module 60. The emission instant Te is indeed equal to the reception instant Tr less a duration Dp of propagation of the first message M1 via the radioelectric link between the primary module 60 and the corresponding secondary module, with the duration of propagation Dp being fixed and known for a predetermined size of the data field of the first message M1. The first secondary module 62A then passes to the step 320 of time synchronisation with the primary module 60.

During the step 320, the synchronisation software 122A proceeds in a manner similar to what was described for the first embodiment.

The beginning instant of the sampling is as such reinitialised in order to ensure the time synchronisation of the information processing unit 78A in relation to the voltage measuring unit 66.

If the first message M1 is not detected by the first secondary module 62A, the receiving window is closed and no resynchronisation is carried out. The secondary module 62A then continues the sampling, such as carried out during the step 340 of the preceding cycle, until a new message M1 is received and then allows the resynchronisation to be carried out. As such, the precision of the measurement is able to be very slightly degraded from a time standpoint, but the system remains operational in the absence of reception of a few messages M1. In other words, the measurement system 20 is robust to a temporary absence of the reception of the first message M1.

The compression software 124A proceeds, during the step 340, in a manner similar to what was described for the first embodiment.

The calculation software 126A then periodically calculates the active energies E1+, E2+, E3+, E1−, E2−, E3− for each of the three phases using the measured values of the voltages V1, V2, V3 received from the primary module 60 via the first message M1 and the values of the intensities I1A, I2A, I3A measured by the current sensors 76A.

For each phase i, a first Ei+ and a second Ei− active energies are calculated. The first active energy Ei+ is the total of the electrical energy consumed by a load connected to the phase i downstream of the corresponding secondary module. The second active energy Ei− is the total of the electrical energy produced by a generator connected to the phase i downstream of the corresponding secondary module. The period of calculation of the active energies E1+, E2+, E3+, E1−, E2−, E3− is equal to the period $P_{voltage}$, which is for example about 20 ms in Europe and about 16.66 ms in the United States.

In a manner similar to the first embodiment, the variations of the voltages V1, V2, V3 are sufficiently limited between two emission instants of the first message M1 to allow calculating the active energies E1+, E2+, E3+, E1−, E2−, E3− every 20 ms, using the values of the intensities I1A, I2A, I3A measured every 20 ms and the values of the voltages V1, V2, V3 received every second.

The active $P_i$ and reactive $Q_i$ powers are calculated in a manner identical to what was described for the first embodiment using the equations (1) to (4), and being given that the first coefficients of the decompositions into Fourier series of each of the voltages V1, V2, V3, on the one hand, and the first coefficients of the decompositions into Fourier series of each of the voltages I1A, I2A, I3A, on the other hand, are calculated with a simultaneity of samplings, i.e. samplings starting at the same instant in light of the resynchronisation of the sampling during the step 320 and having the same sampling frequency $F_{samp}$.

A each period $P_{voltage}$, the first active energy Ei+ is incremented only when $P_{i,1}$ is positive, i.e. the power corresponding to the product of the fundamental of the current and of the fundamental of the voltage is positive, which corresponds to a power consumed by a load downstream of the measurement system.

An increment of the first active energy ΔEi+ is then equal to the product of the period $P_{voltage}$ with the active power $P_{i,1}$ calculated over the last period, according to the following equation:

$$\Delta E_{i+} = P_{voltage} \times P_{i,1} \text{ with } P_{i,1} > 0 \qquad (6)$$

At each period $P_{voltage}$, the second active energy Ei− is incremented only when $P_{i,1}$ is negative, i.e. the power corresponding to the product of the fundamental of the current and of the fundamental of the voltage is negative, which corresponds to a power supplied by a generator downstream of the measurement system.

An increment of the second active energy ΔEi− is then equal to the product of the period $P_{voltage}$ with the active power $P_{i,1}$ calculated over the last period, according to the following equation:

$$\Delta E_{i-} = P_{voltage} \times P_{i,1} \text{ with } P_{i,1} < 0 \qquad (7)$$

For a three-phase electrical network, the measurement system 20 therefore constantly increments six energy meters: E1+, E1−, E2+, E2−, E3+ and E3−. Thus the power produced energy and consumed energy are indeed separate. The measurement system 20 is also adapted to measure the energy supplied by power generators distributed over the electrical network.

In a manner identical to the first embodiment, the second message M2A contains the identifier of the first secondary module 62A, the values of the six energy meters $E_1-$, $E_2+$, $E_2-$, $E_3+$, $E_3-$ for all of the three phases of the three-phase voltage and the complex coefficients Re_j(IiA), Im_j(IiA) of the decomposition into Fourier series of the three currents I1A, I2A, I3A until the harmonic K.

As a supplement, the second message M2A contains the values of the root mean squares, also noted as RMS, of the currents I1A, I2A, I3A of the three phases, as well as the terms $P_{i,1}$ and $Q_{i,1}$ for each of the three phases, and the values $P_i$ and $Q_i$ for each of the three phases.

The steps 400 to 420 are identical to those described for the first embodiment, with the centralisation module 64 recording in its database 88 the values received and contained in the first message M1 and in the second messages M2A, . . . M2N.

As a supplement, during the step 420, the processing software 144 calculates various components that characterise the three-phase voltage of the network, i.e. fundamental complex voltages V11, V12 and V13, a non-zero component V0, a direct component Vd, a negative sequence component Vi and an imbalance Δ using the following equations:

$$V11 = Re\_1(V1) + j \times Im\_1(V1) \qquad (8)$$

$$V12 = Re\_1(V2) + j \times Im\_1(V2) \qquad (9)$$

$$V13 = Re\_1(V3) + j \times Im\_1(V3) \qquad (10)$$

$$V0 = \tfrac{1}{3}(V11 + V12 + V13) \qquad (11)$$

$$Vd = \tfrac{1}{3}(V11 + a \times V12 + a^2 \times V13) \qquad (12)$$

where a is a rotation operator defined by:

$$a = e^{j2\pi/3} \qquad (13)$$

$$Vi = \frac{1}{3}(V11 + a^2 \times V12 + a \times V13) \qquad (14)$$

$$\Delta = \left|\frac{Vi}{Vd}\right| \qquad (15)$$

The non-zero component V0 is zero if the network has no fault.

In the example embodiment of FIGS. 1 to 7 described hereinabove, the electrical network 12 is a three-phase network, and the current measured via the measurement system 20 is a three-phase current. Those skilled in the art will of course understand that the invention also applies to a single-phase electrical network and to the measurement of a single-phase alternating current.

It is also understood that the measurement system 20 according to the invention is more precise, less complex and less expensive.

The invention claimed is:

1. A system for measuring electrical energy of current flowing in at least one secondary electrical conductor, the secondary conductor being electrically connected to a primary electrical conductor, the primary conductor and each secondary conductor having substantially a same voltage, the measurement system comprising:
   a primary module comprising a radioelectric emitter and a voltage measuring device configured to measure voltage of the primary conductor; and
   a plurality of secondary modules, each secondary module comprising a radioelectric receiver, an intensity sensor configured to measure intensity of current flowing in the corresponding secondary conductor, and secondary circuitry configured to calculate electrical energy of the current flowing in the corresponding secondary conductor, wherein
   the primary module comprises primary circuitry configured to compress a measured value of the voltage and emit, from the radioelectric emitter to the radioelectric receiver of the secondary module, a first message containing the compressed value of the voltage measured by the primary circuitry, the primary circuitry is configured to time synchronize each intensity sensor with the voltage measuring device, the secondary circuitry is connected to the radioelectric receiver and is configured to calculate a value of the electrical energy from the value of the measured voltage received from the primary module and from the intensity value measured by the intensity sensor, the first message comprises synchronization data for the time synchronization of each intensity sensor directly with the voltage measuring device, and the primary circuitry is further configured to successively distribute a unique token to the plurality of secondary modules.

2. The system according to claim 1, wherein the secondary module is configured to measure only the intensity of the current flowing in the corresponding secondary conductor, without measuring voltage of the current flowing in the corresponding secondary conductor.

3. The system according to claim 1, wherein the primary circuitry is further configured to calculate coefficients of decomposition into Fourier series of the voltage value measured by the voltage measuring device of the primary module.

4. The system according to claim 1, wherein the secondary circuitry of the secondary module is configured to compress the measured intensity value.

5. The system according to claim 4, wherein the secondary circuitry is configured to calculate coefficients of decomposition into Fourier series of the intensity value measured by the intensity sensor of the secondary module.

6. The system according to claim 1, wherein the secondary circuitry is configured to calculate the value of electrical energy from the compressed values of the measured intensity and of the measured voltage.

7. The system according to claim 1, further comprising a centralization module configured to centralize calculated values of electrical energy, the centralization module comprising a radioelectric receiver, and each secondary circuitry configured to emit, from a corresponding radioelectric emitter to the radioelectric receiver of the centralization module, a second message containing a value of electrical energy calculated by the corresponding secondary circuitry.

8. The system according to claim 7, wherein the secondary circuitry of the corresponding secondary module is configured to emit the second message only when the corresponding secondary module has received beforehand the unique token from the primary module.

9. The system according to claim 1, wherein the first message contains a value of a sampling period at which are calculated coefficients for decomposition into Fourier series of the measured voltage value.

10. The system according to claim 5, wherein the first message contains a value of a sampling period at which are calculated coefficients for the decomposition into Fourier series of the measured intensity value.

11. The system according to claim 1, wherein the radioelectric emitter comprised in the primary module is compliant with ZigBee communication protocol.

12. A unit for transforming an electrical current having a first alternating voltage into an electrical current having a second alternating voltage, the unit comprising:

a first panel comprising at least one inlet electrical conductor configured to be connected to an electrical network, with the inlet conductor having the first alternating voltage;

a second panel comprising at least one primary outlet electrical conductor and at least one secondary outlet electrical conductor, each secondary outlet conductor being connected electrically to a corresponding outlet primary conductor, with the corresponding outlet conductors having the second alternating voltage;

an electric transformer connected between the first panel and the second panel and configured to transform the current having the first alternating voltage into the current having the second alternating voltage; and the system for measuring the electrical energy of the current flowing in each secondary outlet conductor according to claim 1.

13. A method for measuring electrical energy of current flowing in at least one secondary electrical conductor, the secondary conductor being electrically connected to a primary electrical conductor, the primary conductor and each secondary conductor having substantially same voltage, the method comprising:

measuring, by a primary module comprising a voltage measuring device, voltage of current flowing in the primary conductor;

measuring, by an intensity sensor of a secondary module of a plurality of secondary modules, intensity of current flowing in the corresponding secondary conductor;

calculating, by the secondary module, a value of electrical energy of the current flowing in the corresponding secondary conductor;

compressing a measured voltage value and emitting, by the primary module, a first message containing the compressed value of the measured voltage, via a radioelectric link between the primary module and the secondary module;

time synchronizing the measurement of the intensity with the measurement of the voltage; and successively distributing a unique token to the plurality of secondary modules, wherein the first message comprises synchronization data for the time synchronization of the intensity sensor directly with the voltage measuring device, and the calculating of the value of electrical energy is carried out from the measured voltage value received from the primary module and from the intensity value measured by the intensity sensor.

14. The method according to claim 13, further comprising regularly measuring, by the primary module, a period of the voltage, the period of measurement being equal to 10 seconds.

* * * * *